US010198110B2

(12) United States Patent
Suwald et al.

(10) Patent No.: US 10,198,110 B2
(45) Date of Patent: Feb. 5, 2019

(54) TOUCH SENSOR THAT UTILIZES A TOUCH AREA WITH A SINGLE CONDUCTIVE PATH

(71) Applicant: NXP B.V., Eindhoven (NL)

(72) Inventors: Thomas Suwald, Hamburg (DE); Arne Burghardt, Hamburg (DE)

(73) Assignee: NXP B.V., Eindhoven (NL)

( * ) Notice: Subject to any disclaimer, the term of this patent is extended or adjusted under 35 U.S.C. 154(b) by 182 days.

(21) Appl. No.: 15/041,005

(22) Filed: Feb. 10, 2016

(65) Prior Publication Data

US 2016/0231856 A1 Aug. 11, 2016

(30) Foreign Application Priority Data

Feb. 10, 2015 (EP) ..................... 15154542

(51) Int. Cl.
*G06F 3/044* (2006.01)
*G06F 3/041* (2006.01)
*G06K 19/07* (2006.01)
*H03K 17/96* (2006.01)

(52) U.S. Cl.
CPC ............ *G06F 3/0416* (2013.01); *G06F 3/044* (2013.01); *G06K 19/0723* (2013.01); *H03K 17/9622* (2013.01); *H03K 2017/9606* (2013.01); *H03K 2217/9605* (2013.01); *H03K 2217/96074* (2013.01); *H03K 2217/960725* (2013.01)

(58) Field of Classification Search
CPC ..................................................... G06G 3/044
See application file for complete search history.

(56) References Cited

U.S. PATENT DOCUMENTS

| 2004/0104826 A1* | 6/2004 | Philipp ..................... G01D 5/24 341/34 |
| 2012/0019265 A1 | 1/2012 | Yoshikawa |
| 2013/0196596 A1* | 8/2013 | Parekh .................. G06F 1/1643 455/41.1 |
| 2013/0310985 A1 | 11/2013 | Tu |
| 2014/0152610 A1 | 6/2014 | Suwald |
| 2016/0054846 A1* | 2/2016 | Lee ........................ G06F 3/0416 345/174 |
| 2016/0259442 A1* | 9/2016 | Ukai ....................... G06F 3/0416 |

FOREIGN PATENT DOCUMENTS

| EP | 2 637 308 A1 | 9/2013 |
| EP | 2 667 156 A1 | 11/2013 |

OTHER PUBLICATIONS

Extended European Search Report for Patent Appln. No. 15154542.3 (dated Aug. 6, 2015).

* cited by examiner

*Primary Examiner* — Sanghyuk Park

(57) ABSTRACT

It is disclosed a touch sensor (100,200,300,400,500,700) for sensing a user touch, comprising an electrically conductive structure (101) having an electrically conductive touch area (103) exposed to the environment; a first capacitor (115) having a first electrode (117) electrically connected with the conductive structure (101); a second capacitor (119) having a first electrode (121) connected to a second electrode (123) of the first capacitor (115); and a driver arrangement (125) connected to the first capacitor and the second capacitor and adapted to perform particular operation steps.

15 Claims, 6 Drawing Sheets

| STEP | S11H | S11L | S12H | S12L | S13H | S13L | S2H | S2L | S3H | S3L | FUNCTION |
|---|---|---|---|---|---|---|---|---|---|---|---|
| A | X | — | — | — | — | — | — | X | — | X | Reset Cint |
| B1 | — | X | X | — | X | — | X | — | — | — | Reset Cs2, Cs3 |
| C1 | — | X | X | — | X | — | — | — | — | — | Disconnect Node Z |
| D1 | — | X | — | X | — | X | — | — | — | X | Charge Cint |
| E | — | X | — | X | — | X | — | — | — | X | Reverse C2, C3 |
| F | — | X | — | X | — | X | — | — | — | X | Measure Cint |
| G | — | X | — | X | — | — | — | — | — | — | Disconnect Cint |
| A | X | — | — | — | — | — | — | X | — | X | Reset Cint |
| B2 | X | X | — | — | X | — | X | — | — | — | Reset Cs1, Cs3 |
| C2 | X | X | — | — | X | — | — | — | — | — | Disconnect Node Z |
| D2 | X | — | — | X | — | X | — | — | — | X | Charge Cint |
| E | — | — | — | X | — | X | — | — | — | X | Reverse C1, C3 |
| F | — | — | — | X | — | X | — | — | — | X | Measure Cint |
| G | — | — | — | X | — | — | — | — | — | — | Disconnect Cint |
| A | X | — | — | — | — | — | — | X | — | X | Reset Cint |
| B3 | X | X | X | — | — | — | X | — | — | — | Reset Cs1, Cs2 |
| C3 | X | X | X | — | — | — | — | — | — | — | Disconnect Node Z |
| D3 | X | — | — | X | — | X | — | — | — | X | Charge Cint |
| E | — | — | — | X | — | X | — | — | — | X | Reverse C1, C2 |
| F | — | — | — | X | — | X | — | — | — | — | Measure Cint |
| G | — | — | — | X | — | X | — | — | — | — | Disconnect Cint |
| H | — | — | — | — | — | X | — | — | — | — | Calculate |

Fig. 11

TOUCH SENSOR THAT UTILIZES A TOUCH AREA WITH A SINGLE CONDUCTIVE PATH

CROSS-REFERENCE TO RELATED APPLICATIONS

This application claims the priority under 35 U.S.C. § 119 of European patent application no. 15154542.3, filed on Feb. 10, 2015, the contents of which are incorporated by reference herein.

FIELD OF THE INVENTION

The present invention relates to a touch sensor, to a touch sensor system including an NFC-tag and to a method for sensing a user touch. In particular, the invention also relates to a user device comprising an electronic tag. Further, the invention relates to the integration of a touch point sensor that enables the user to interface with the user device such that the tag may provide user-dependent information to a reader device or vice versa.

BACKGROUND OF THE INVENTION

It may have become quite popular in recent years to integrate electronic tags, such as Near Field Communication (NFC) tags or Ultra High Frequency (UHF) tags, into electronic user devices, e.g. into electronic gaming devices. The conventional tag devices can only provide a previously defined response. Thereby, the operation of the conventional tag devices may not satisfy requirements in all situations.

US 2014/152610 discloses a capacitive position sensor system for determining the position of an object, wherein the object is positioned within a sensitive area of the capacitive position sensor system and changes the capacitance of capacitors being arranged underneath the object.

It has however been observed that the conventional systems do not satisfy all requirements regarding simplicity, reliability of operation, volume and costs.

OBJECT AND SUMMARY OF THE INVENTION

Thus, there may be a need for a touch sensor for sensing a user touch, for a touch sensor system including an RFID tag and for a method of sensing a user touch, where at least some of the aforementioned problems of the prior art are reduced. There may further be a need for a solution of a low cost implementation of a user configurable tag response.

According to an embodiment of the present invention it is provided a (one point or multiple point) touch sensor for sensing a user touch, comprising an electrically conductive structure having an electrically conductive touch area exposed to the environment, a first capacitor having a first electrode electrically connected with the conductive structure, a second capacitor having a first electrode connected to a second electrode of the first capacitor, and a driver arrangement connected to the first capacitor and the second capacitor and adapted to perform the operation steps: to supply a driving signal to the first capacitor to charge the first capacitor, to stop supplying the driving signal to the first capacitor, allowing a charge state of the first capacitor to be influenced by an object electrically contacting the touch area; to transfer a charge of the first capacitor to the second capacitor; and to measure the charge state of the second capacitor.

The touch sensor may for example sense or detect or identify a touch of a part of a user, for example a touch of a part of the body of the user, such as the hand, the arm, the leg, the foot, the finger or the like. The user touch may be established when there is direct physical and electrical contact to the touch area or at least a portion of the touch area. The touch area may be accessible from outside the touch sensor for a user or a part of a body of the user. The touch area may comprise for example a plane surface or a curved surface or a combination of curved and plane surface portions. The touch area may for example have a size of 1 mm×1 mm to 20 mm×20 mm. Other sizes are possible. The size of the touch area may be adapted according to the particular application. When a portion or a part of the body of the user, such as a finger, touches the touch area, an electric current is allowed to flow from the touch area to the user or vice versa. Thereby, the user may directly or indirectly be (electrically) connected to the earth (electric potential). The user may for example stand on the ground and may thereby be connected to the earth potential via his or her feet.

The electrically conductive structure may assume all kinds of shapes and may be manufactured of a variety of material, including electrically conductive materials. For example, the conductive structure may be a composite including insulating material and electrically conductive material. In particular, the conductive structure may comprise plastic, polymers in which conductive material is embedded, such as graphic fibers or graphic particles. In other embodiments, the conductive structure may for example comprise pure metal or an alloy of different metals. The conductive structure may allow to transfer the information that a user has touched the touch area to another location, for example a location within the touch sensor which is not exposed to the environment.

The first capacitor as well as the second capacitor may be conventionally available electronic parts. The first capacitor may be a PCB structure (made of or including tracks of conductive material), the second capacitor may be a PCB structure (made of or including tracks of conductive material). In other embodiments, the first capacitor and the second capacitor may be integrated in an integrated circuit. When the first capacitor is charged, an electric field may be present between the first electrode of the first capacitor and the second electrode of the first capacitor. The first electrode of the first capacitor may for example be electrically connected via an electrical trace to the conductive structure, in particular to a portion of the conductive structure being spaced apart from the conductive touch area. Thereby, when a user touches the touch area and a current flows between the touch area and the user, the first capacitor may be charged or discharged. The first capacitor may have a relatively low capacity such that it may be charged just by a noise electric potential which may be present at for example a finger of the user.

The second capacitor may act as an integrating capacitor which may successively accumulate for a number of times the charge of the first capacitor during operation of the touch sensor. The driver arrangement may comprise circuitry to set the first capacitor and the second capacitor in different operation conditions and to perform the operation steps as indicated above. Thereby, the driver arrangement may comprise a number of conventionally available (programmable) modules, such as general purpose input/output pins. The driver arrangement may further comprise a controller and a processor for processing signals indicating the charge state for example of the second capacitor. Furthermore, the driver arrangement may comprise an electronic storage for storing for example reference values, such as a reference number and may also comprise a processor having arithmetic/logic functionality. Furthermore, the driver arrangement may comprise an oscillator, for example for generating a clock signal. The touch sensor may be integrated into one integrated circuit on a single die or may be assembled from several components and put together.

The touch sensor may for example be used on a figurine or figure for a game. Thereby, interactivity of the figure may be achieved.

When supplying the driving signal to the first capacitor, the first electrode of the first capacitor may be set to a defined voltage, for example positive voltage. The positive voltage generated by a voltage source may be disconnected from the first capacitor to stop supplying the driving signal to the first capacitor. When the constant supply voltage is disconnected from the first capacitor, the first capacitor is activated to be sensitive to a user touch occurring at the touch area. The charge state of the first capacitor may be characterized by a voltage between the first electrode and the second electrode of the first capacitor or may be characterized by a charge which is present on the first electrode and/or the second electrode of the first capacitor. The charge of the first capacitor may be transferred to the second capacitor to accumulate numeral charges from the first capacitor at the second capacitor. Thereby, the accuracy of the detection or sensing of a user touch may be improved. Further, noise may be reduced.

Measuring the charge state of the second capacitor (also referred to as integrating capacitor) may for example comprise measuring a voltage across the first electrode and the second electrode of the second capacitor. The voltage may for example be measured using an operational amplifier and/or comparator which determines whether a difference between the voltage across the electrodes of the second capacitor is larger than a reference voltage.

In the prior art, for example the above-mentioned US application there is a need of capacitance sensor structures to be implemented into the user device. However, there was the desire by the device manufacturers to apply sensing techniques that are better compatible with plastic molding but still provide good noise immunity. This goal is now achieved by some embodiments of the present invention, in particular in which the electrically conductive structure is mainly manufactured from plastic or plastic molding and further comprises some electrically conductive material. According to embodiments of the present invention, a desire to provide a processing unit for sensors made from conductive material is met.

According to embodiments of the present invention, the touch sensor may comprise or may be made of molded conductive plastic material. Further, a stable touch detection may be achieved by the touch sensor even in a contactless operation mode (in which the touch sensor and/or a tag connected thereto has no galvanic connection to earth potential). Furthermore, embodiments of the present invention may enable a hybrid integration method based on a DC input source and an AC input source having a DC component superimposed. Further, the touch sensor may support battery-less operation, in particular powered by a near field communication field, for example according to ISO 14443. In particular, the field may have a frequency of 13.56 MHz or the like. Furthermore, the touch sensor and a corresponding touch sensor system may have low processing requirements and may enable ultra-low cost implementation, since conventional modules or units may be used for manufacturing the touch sensor.

According to an embodiment of the present invention, while stopping supplying the driving signal to the first capacitor and while a user touching the touch area, electric charge on the first capacitor is discharged by electric current flow from the first capacitor via the conductive structure and the user to earth.

In particular, the sensing principle is not based on capacitive sensing but on changing or influencing a charge on the first capacitor due to electric current flowing from the first capacitor via the electrically conductive structure and the user to earth. A portion of electric charge may be discharged from the first capacitor, when an object, such as a finger, touches an electrically contacts the touch area. Thereby, only one line (or electric path) leading from the first plate of the first capacitor to the touch area is necessary to construct the touch sensor. Thereby, the construction of the touch sensor is simplified and a reliable operation may be ensured. Furthermore, the first capacitor may be an individual module or component and may not be required to be assembled from wire portions as has been observed for conventional capacitive based systems.

According to an embodiment of the present invention, the conductive structure comprises plastic including carbon, in particular carbon fibers, wherein a resistance of the conductive structure is in particular between 1 k$\Omega$ to 1000 k$\Omega$.

Using plastic or polymers for manufacturing the conductive structure enables a very cost-effective component. Furthermore, carbon fibers exhibit very good conductive properties and are available in a conventional manner. The resistance of 1 k$\Omega$ to 1000 k$\Omega$ may result in a very low current flowing from the first capacitor to the user or vice versa thereby reducing risk of damage.

According to an embodiment of the present invention, to transfer a charge of the first capacitor to the second capacitor, the second electrode of the second capacitor is set to earth potential, wherein, to measure the charge state of the second capacitor, the second electrode of the second capacitor and the first electrode of the first capacitor are set to earth potential.

For transferring the charge of the first capacitor to the second capacitor, a switch may be provided to allow connection or disconnection of the second electrode of the second capacitor to the earth potential. Thereby, the transfer of the charge may be easily achieved by a simple construction. Further, to measure the charge state, also a switch or switch system may be provided to fulfill this function. Thereby, a simple construction and cost-effective construction of the touch sensor may be achieved.

According to an embodiment of the present invention, the second capacitor has a at least 50 times higher capacity than the first capacitor, the second capacitor in particular having capacity (e.g. between 1 nF and 100 nF) between 50 times and 10,000 the capacity of the first capacitor, wherein further in particular the operation steps last between 1 $\mu$s and 1000 $\mu$s, further in particular between 2 $\mu$s and 10 $\mu$s.

The second capacitor may integrate charge over some several cycles of transferring the charge from the first capacitor to the second capacitor. Thereby, the reliability of the detection of an actual user touch event may be improved. Furthermore, measuring inaccuracies may be reduced. Further, conventionally available capacitors having the specified capacities may be utilized for manufacturing the touch sensor.

According to an embodiment of the present invention, the driver arrangement is adapted to repeat the operation steps several times, to count the number of times until a charge state of the second capacitor has reached a threshold charge state, to compare the number of times to a reference number, and to indicate a user touch, if the number of times is at least a threshold number larger or smaller than the reference number.

The driver arrangement may be programmable by generating a program, storing the program in an electronic storage and loading the program into a processor which may be included in the driver arrangement. The number of times the operation steps are repeated may depend on a relative capacity of the second capacitor and the first capacitor. The operation steps may be repeated essentially so that or until the second capacitor is fully charged when the repetition of the operation steps completes. Thereby, during a calibration run, the number of repetition cycles may represent a situation, when no touch event occurred during the repetition cycles. The corresponding number of cycles may be stored as a reference number indicating that no touch event has occurred. Whenever a touch event occurred during the repetition cycles, the number of cycles required to fully charge the second capacitor may increase, since during the repetition cycle, some charge of the first capacitor may be withdrawn by current flow via the conductive structure and the user to earth. Thus, when the number of repetition cycles required to fully charge the second capacitor is larger than the reference number, it may be concluded or determined, that a user touch event has occurred. Moreover, a time span or time period during which the user touch event occurred and/or a user force or level of engagement of the touch event and/or contact size between finger and touch area may be determined based on a deviation between the actually measured number of repetition cycles to fully charge the second capacitor and the reference number. Thereby, a reliable touch sensor may be provided.

According to an embodiment of the present invention, a deviation between the number of times and the reference number is determined, wherein a force of touch or a size of a contact area or an effective resistance is determined based on the deviation. When the size of a contact area between the body portion of the user, for example finger, increases, a resistance on the electrical path from the first capacitor to the earth may decrease and thus the current flowing from the first capacitor to earth may increase, thereby more quickly discharging the first capacitor. This increase of the size of the contact area may in particular occur, when the user presses with more and more force onto the touch area. Alternatively or additionally, also the time period during which the user touches the touch area may be derived from the deviation, since if the time span of the touching event is becoming larger more cycles elapse during the repetition cycle will allow discharging the first capacitor.

Thereby, a detailed characteristic of the user touch event, for example regarding its length in time, regarding its pressure or force may be derived or determined. Thus, a specific individually generated interaction may be monitored.

According to an embodiment of the present invention, the touch sensor has, during operation, in particular no galvanic connection to earth. Thus, no particular electrical requirements may be necessary for the touch sensor.

According to an embodiment of the present invention, the driver arrangement further comprises: a first general-purpose input/output pin connected with the first electrode of the first capacitor; a second general-purpose input/output pin connected to the second electrode of the first capacitor and the first electrode of the second capacitor; a third general-purpose input/output pin connected to the second electrode of the second capacitor; and a controller for controlling the first, the second and the third general-purpose input/output pin, in order to perform the operation steps in a repeated manner.

The general-purpose input/output (GPIO) may be a generic pin on an integrated circuit whose behavior, including whether it is an input or output pin, can be controlled by the user at run time or may be programmable. In particular, the GPIO pins may be controlled by the controller. The GPIO may for example generate a (constant) voltage to charge the first capacitor. Further, the GPIO may act as a high ohmic input line such as to enable to set a particular electrical node as electrically floating, for example in the case where the first capacitor is intended to sense a user touch event. Furthermore, the GPIO may be adapted to set its pin to essentially earth potential or a reference potential which may be different from the earth potential and which may be referred to as mass or "0". Thereby, the touch sensor may be assembled from conventionally available components.

According to an embodiment of the present invention, the touch sensor comprises at least one further (in particular plural further) electrically conductive structure having at least one (respective) further electrically conductive touch area exposed to the environment and electrically separated from the touch area; at least one further first capacitor having a further first electrode electrically connected with the further conductive structure; at least one further first general-purpose input/output pin connected with the respective further first electrode of the further first capacitor, wherein the touch sensor is adapted to perform the operation steps for each of the further first capacitors while at least one of the first capacitor and the further first capacitor is inactivated, in particular by charging the capacitors by supplying a charging signal.

Thereby, a touch sensor having several touch areas may be provided. In particular, the touch areas may be arranged in a line or in an array, such that a one-dimensional or two-dimensional position sensitive sensor may be provided. The touch areas may be electrically isolated from each other. Each touch area may have an associated first capacitor. However, there may only be one second capacitor and the different touch areas may be switched active or inactive in a successive manner such that for example exactly one touch area is active, all others are inactive or such that all but one touch areas are active and the other touch area is inactive. Thereby, a reliable position sensor may be achieved.

According to an embodiment of the present invention, the touch sensor further comprises an acoustic and/or optical and/or electrical indicator for indicating a user touch event. Thereby, the user may get a feedback whether the touch sensor has actually detected a particular user action.

According to an embodiment of the present invention, a touch sensor system is provided which comprises a touch sensor according to one of the embodiments as explained above and a NFC-tag coupled with the touch sensor for providing electric energy to the touch sensor and/or for communicating touch sensor data to a reader device and/or for communicating reader data to the touch sensor. The NFC tag may for example comprise an antenna for receiving a reader field, a processor for decoding and coding data to be sent to the reader device or to be received from the reader device. Thereby, an electronic NFC device having the capability of interactivity with a user may be provided. Further, the touch sensor system may be embodied as a gaming device, such as a figurine which may then behave in dependence of touch events sensed by the touch sensor. In particular, the touch sensor system may transmit data regarding the touch or the user touch event to the reader device to be processed by the reader device. Upon that, the reader device may send reader data to the touch sensor system which may also change the behavior of the figurine, for example.

It should be understood that features which have been individually or in any combination disclosed, described, applied or provided for a touch sensor for sensing a user touch may also be used or applied for a method for sensing a user touch according to an embodiment of the present invention and vice versa.

According to an embodiment of the present invention it is provided a method for sensing a user touch, comprising: supplying a driving signal to a first capacitor to charge the first capacitor, the first capacitor having a first electrode electrically connected with a conductive structure; stopping supplying the driving signal to the first capacitor, touching an electrically conductive touch area exposed to the environment with a finger, the touch area being part of the conductive structure; allowing a charge state of the first capacitor to be influenced by the finger touching the touch area; transferring a charge of the first capacitor to a second capacitor having a first electrode connected to a second electrode of the first capacitor, and measuring the charge state of the second capacitor.

The method may in particular be performed using the touch sensor as explained or described in one of the above embodiments.

The method may further comprise indicating a user touch event, if the charge state of the second capacitor reaches or supersedes a charge state threshold. Thereby, a feedback for the user may be provided.

Furthermore, a computer-readable medium is provided, in which a computer program for sensing a user touch is stored, which computer program, when being executed by a processor, is adapted to carry out or control a method according to one of the aforementioned embodiments. The computer program may in particular control a touch sensor according to an embodiment of the present invention.

A signal processing method according to an embodiment of the present invention may identify a user who has engaged by his finger with a touch sensor made from conductive plastic material, wherein the touch sensors may be part of an interactive tag that has no galvanic connection to earth potential. According to an embodiment of the present invention, the signal processing method or method for sensing a user touch may comprise a FIR filtering method which provides stable touch detection even in a presence of a radio frequency reader electromagnetic field. Different from conventional projective capacitive touch sensing methods, the touch sensor according to embodiments of the present invention comprises conductive plastic material, where due to cost, reliability or irregular shape device surface projective touch may not be applied. The touch sensor may, according to embodiments of the present invention, be implemented in interactive gaming figurines as used for example by computer role plays.

The touch sensor may be integrated in any kind of electronic device. Thereby, the electronic device may for example be a keypad, a smartcard, a mobile device, a computer, a gaming component or the like. Due to the low energy consumption, the touch sensor may be used for many applications having strict volume or energy requirements. The touch sensor may for example be integrated in a secure element of an electronic device, such as a mobile phone.

Embodiments of the present invention are now described with reference to the accompanying drawings. The invention is not limited to the illustrated or described embodiments.

BRIEF DESCRIPTION OF THE DRAWINGS

FIG. 11 schematically illustrates switching states in a touch sensor during operation steps according to an embodiment of the present invention.

Figure 1:
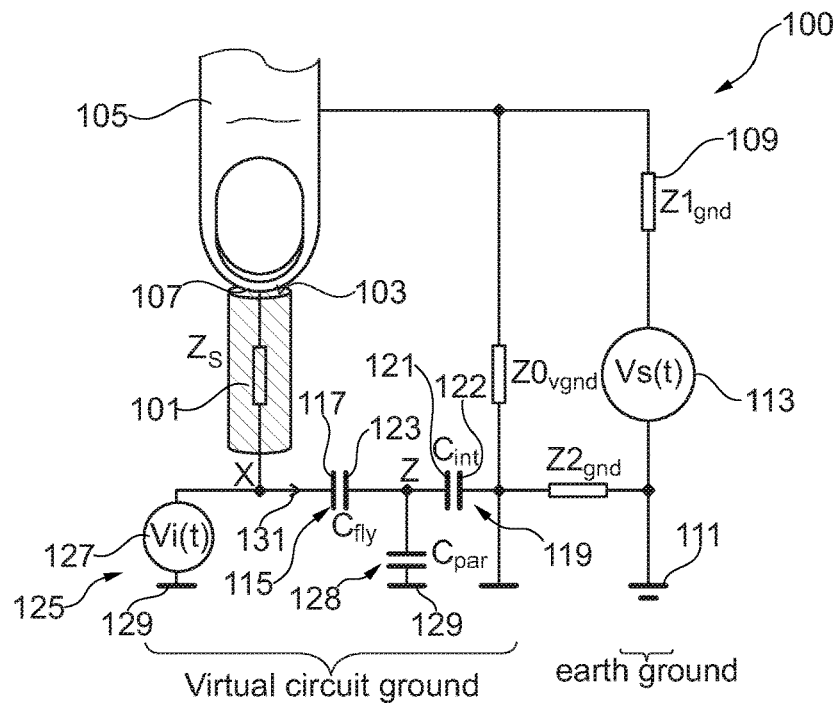
FIG. 1 is a schematic circuit diagram of a touch sensor according to an embodiment of the present invention.

The touch sensor 100 according to an embodiment of the present invention illustrated in FIG. 1 comprises an electrically conductive structure 101 having an electrically conductive touch area 103 exposed to the environment, such that a finger 105 may touch or contact with its tip 107 the touch area 103 such that an electric contact is achieved so that an electric current may flow from the conductive structure 101 to the finger 105 and from there via the body of the user represented by a resistor 109 to the earth potential 111. Due to fluctuations and disturbances, the finger 105 may be subjected to a noise electric potential as is represented by the voltage source 113.

The touch sensor 100 further comprises a first capacitor 115 having a first electrode 117 electrically connected with the conductive structure 101. The touch sensor 100 further comprises a second capacitor 119 having a first electrode 121 connected to a second electrode 123 of the first capacitor 115.

Furthermore, the touch sensor 100 comprises a driver arrangement 125 comprising a voltage source 127 which may be set into different operation states during operation of the touch sensor 100. The driver arrangement is connected to the first capacitor 115 and the second capacitor 119. It should be noted that the touch sensor 100 is not necessarily connected to earth ground 111 but may float to its own reference potential 129. The driver arrangement 125 is adapted to perform the following operation steps:

to supply a driving signal 131 to the first capacitor 115 to charge the first capacitor 115, to stop supplying the driving signal 131 to the first capacitor 115, allowing a charge state of the first capacitor 115 to be influenced by an object, for example the finger 105, electrically conducting the touch area 103, to transfer a charge of the first capacitor 115 to the second capacitor 119, and to measure the charge state of the second capacitor 119.

Figure 2:
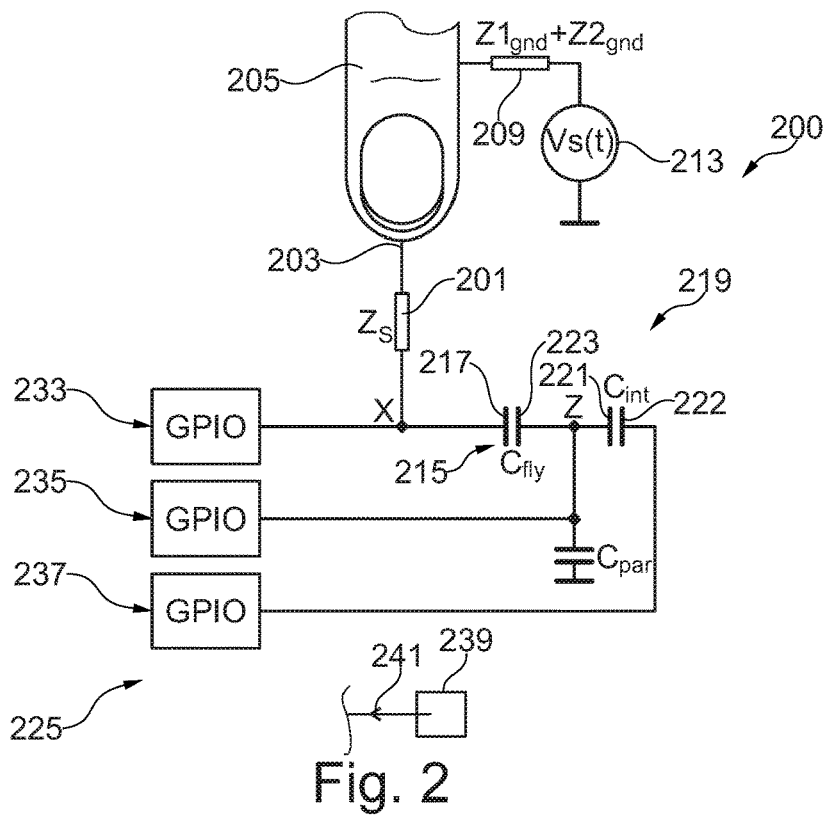
FIG. 2 illustrates an implementation of a touch sensor according to an embodiment of the present invention, FIG. 3 schematically illustrates a touch sensor system according to an embodiment of the present invention.

FIG. 2 illustrates one implementation of a touch sensor 200 according to an embodiment of the present invention, wherein elements similar in structure and/or function in FIGS. 1 and 2 are denoted with reference signs differing only in the first digit. In the touch sensor 200 illustrated in FIG. 2, the driver arrangement comprises a first general-purpose input/output pin (GPIO) 233 which is connected with the first electrode 217 of the first capacitor 215. The driver arrangement 225 further comprises a second GPIO 235 connected to the second electrode 223 of the first capacitor 215 and to the first electrode 221 of the second capacitor 219. The driver arrangement 225 further comprises a third GPIO 237 which is connected to the second electrode 222 of the second capacitor 219. The driver arrangement 225 further comprises a controller 239 controlling, via control signals 241, the first, the second and the third GPIO 233, 235, 237.

In FIGS. 1 and 2, the first capacitor 115 (Cfly) and the second capacitor 119 (Cint) in conjunction with the voltage source 127 (Vi(t)) form a switched capacitor integrator. Vi(t) may be switched from 0 to Vi, resulting in a current through the first capacitor 115 that adds charge to a parasitic capacitor 128. After a settling period Vi(t) is disconnected, leaving the node X in a high-ohmic state, in which noise source Vs(t) (113) may be connected through Zlgnd and Zs to the first capacitor 115, which is the case if the touch point X, i.e. the touch area 103, is touched by the finger 105, resulting in a change of the voltage across the second capacitor 121 due to the superimposed DC component of Vs(t). The steps mentioned before being performed by the driver arrangement are cyclically repeated until the voltage across the second capacitor 119 has reached a predefined voltage threshold. The number of cycles required to charge the second capacitor 119 to the predefined voltage threshold is a measure for the level of engagement of a user body part, for example a finger 105, and the touch sensor point and is in the following description titled as "activity-level".

Comparing the voltage across the second capacitor 119, 219 to a known reference situation (where nothing touches the touch area 103) may provide a clear indication whether touch point X has been touched by the user, i.e. indication whether the touch area 103 has been touched by the finger 105. It may be irrelevant whether the activity-level in a touched state is significantly smaller or larger than the activity-level in an untouched condition because the absolute deviation may be used to determine a touch event. Other embodiments are possible. Resistor Zs may be comprised by the series resistance of the conductive plastic material used as the touch terminal or touch area 103.

For charging the first capacitor 215, the first GPIO 233 may output a constant voltage Vcc. Then, the GPIO 233 may be set to an input mode such that the first capacitor 215 is not charged anymore by the first GPIO 233. To transfer the charge of the first capacitor 215 to the second capacitor 219, the third GPIO 237 may provide a signal corresponding to 0 voltage (mass). To measure the charge state, in particular voltage of the second capacitor 219, the second GPIO 235 may be set in an input mode for example. Other state combinations of the GPIOs 233, 235, 237 to achieve the different operation steps performed by the driver arrangement 225 are possible.

The number of cycles required to fully charge the second capacitor 219 may be counted and may be stored within the controller 239 or any other suitable electronic storage. The number of cycles required to fully charge the second capacitor 219 may be compared to a reference number which may also be stored in the controller 239. Depending or based on the deviation between the actually required number to fully charge the second capacitor and the reference number it may be determined, whether a user has touched the touch area 203, how long the user has touched the touch area 203 and/or how forcefully the user has touched the touch area 203.

Figure 3:
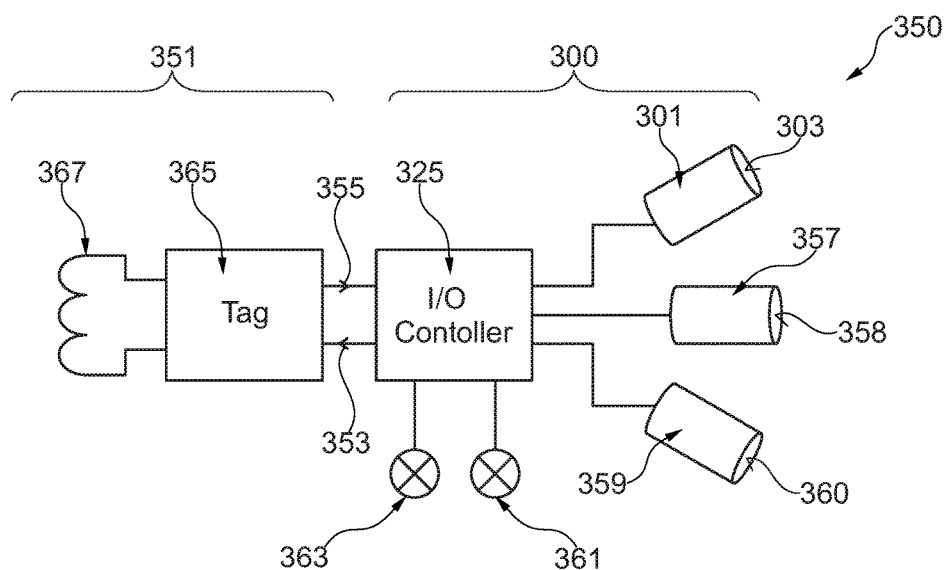

The touch sensor system 350 illustrated in FIG. 3 comprises a touch sensor 300 and a NFC tag 351 which is coupled with the touch sensor 300 for providing electric energy to the touch sensor 300 and/or for communicating touch sensor data 353 to a not illustrated reader device (via the tag 351) and/or for communicating reader device data 355 to the touch sensor 300. The touch sensor 300 is embodied as a multi-touch pad sensor comprising a conductive structure 301, a first further conductive structure 357 and a second further conductive structure 359 each having a corresponding touch area 303, 358 and 360, respectively. Further, the touch sensor comprises touch indicators 361 and 363 for indicating touch events of one or more of the touch areas 303, 358, 360. The NFC tag 351 comprises a tag processor or tag 365 and an antenna 367.

Figure 4:
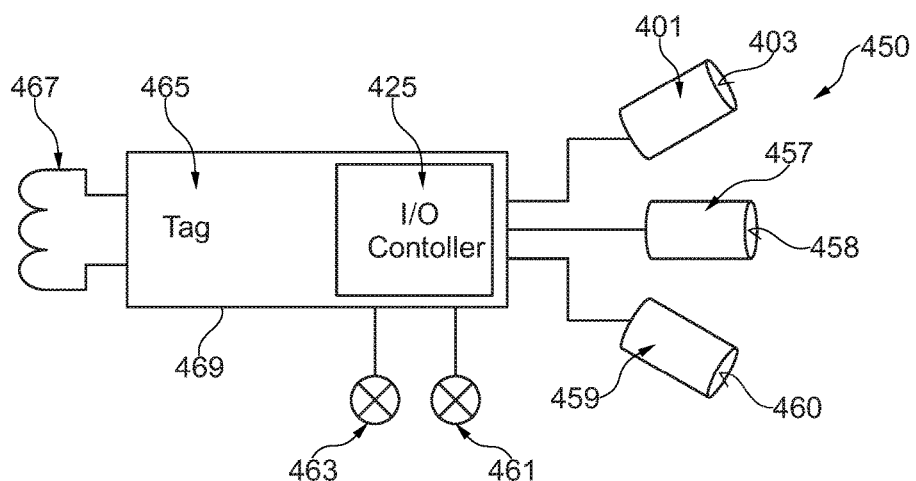
FIG. 4 schematically illustrates a touch sensor system according to an embodiment of the present invention.

The processing module indicated in FIG. 3 may comprise the functionality tag 365 including rectifier and power supply, touch sensors 301, 357, 359 and an I/O controller 325 acting as touch sensor processor and/or acting as driver arrangement according to embodiments of the present invention. The functionalities mentioned above may be implemented with individual integrated components and discrete components or by monolithic integration, as indicated in FIG. 4. An optical (361) and/or acoustical (363) feedback indicator may be added for better user guidance during data entry. The feedback is illustrated schematically and the reader of the skilled art may implement such indicators in the best possible way.

The embodiment 450 of a touch sensor system illustrated in FIG. 4 has many similarities with the touch sensor system 350 illustrated in FIG. 3, except that the driver arrangement and I/O controller 425 is integrated together with the tag 465 in a single semiconductor die or single integrated circuit 469. The monolithic integrated version of the touch sensor function of the I/O controller may be integrated by a state machine controlling the required I/Os of that circuit.

Figure 5:
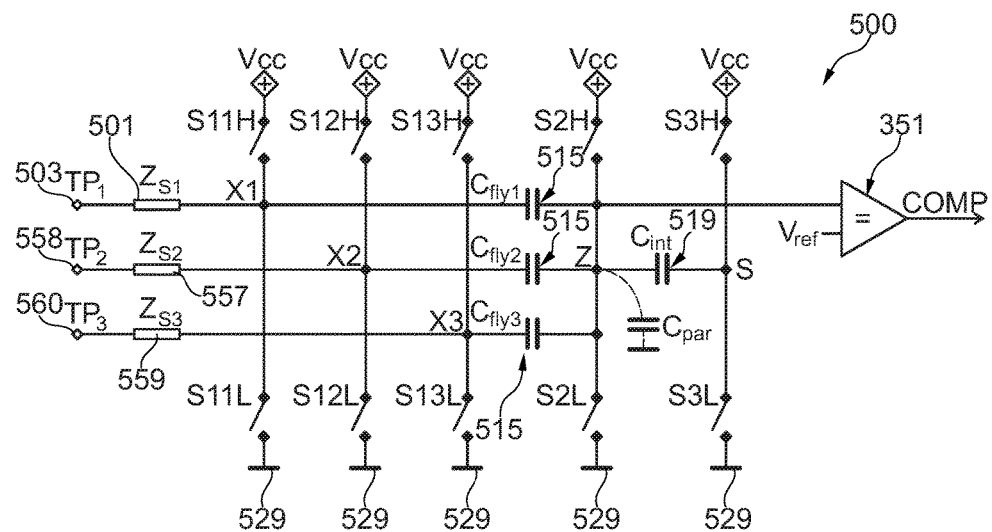
FIG. 5 schematically illustrates a circuit diagram of a touch sensor having multiple touch points according to an embodiment of the present invention.

The touch sensor 500 illustrated in FIG. 5 comprises some elements which are also comprised in the touch sensor 100 and 200 illustrated in FIGS. 1 and 2 which elements are labeled with the reference signs differing only in the first digit. In contrast to the touch sensors 100 and 200 illustrated in FIGS. 1 and 2, the touch sensor 500 illustrated in FIG. 5 is adapted as a multi-touch point sensor comprising touch areas 503, 558 and 560 as the touch sensors 300 and 400 illustrated in the touch sensor system in FIGS. 3 and 4. Each of the touch points or touch areas 503, 558 and 560 has an associated first capacitor 515 whose charge state may be influenced when the capacitor is activated and an object contacts the associated touch point 503, 558 or 560. For activation or inactivation of the touch points 503, 558 and 560, or for charging the first capacitors 515, the switches S11H, S12H, S13H, S2H and S3H allow to connect a constant voltage Vcc or '0' to particular nodes of the circuitry or let them float. E.g., the switches S11L, S12L, S13L, S2L and S3L allow to set particular nodes of the circuitry to a reference potential 529 as has also been depicted in FIG. 1. For the setting of the different switches for performing the operation steps charging the first capacitor, activating the corresponding or associated touch area for detecting a user touch, transferring the charge from the first capacitor and the second capacitor and measuring the charge of the second capacitor it may also be referred to the above-mentioned document US 2014/152610. The settings of the switches may in the different operation states be adjusted for example as illustrated in FIG. 11.

Figure 6:
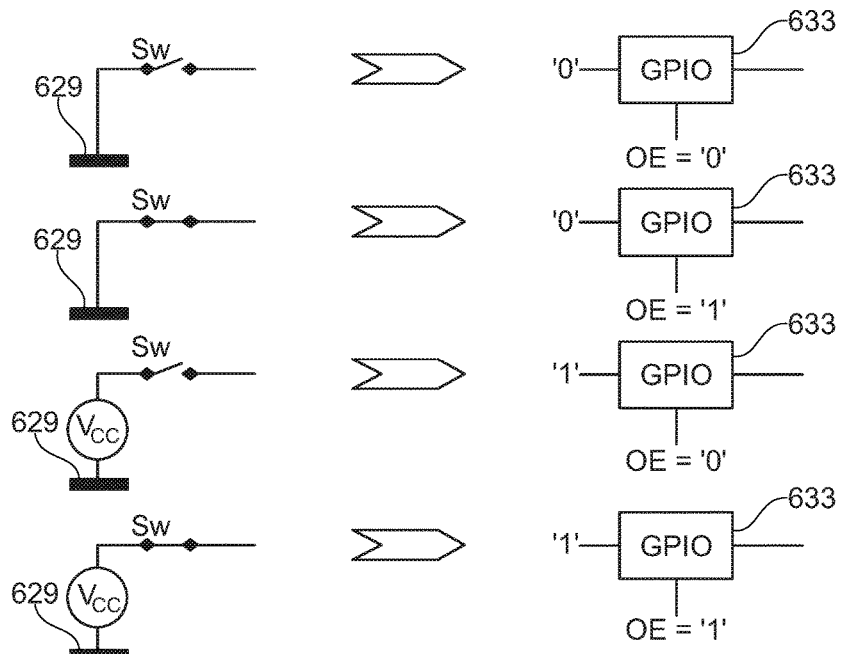
FIG. 6 schematically illustrates implementation details of switching states occurring in embodiments of the present invention.

Every touch area 503, 558, 560 in FIG. 5 may provide an activity-level that may relate to the level of engagement of a user's finger with one of the conductive plastic sensor (TP1, TP2, TP3). The switches SXX indicated in FIG. 5 may be implemented by controlled GPIOs of a microcontroller unit (MCU), using the conversion relations as indicated in FIG. 6. FIG. 6 illustrates how different switching states of switches on the left-hand side may be implemented using a GPIO 633. For example, to implement an open switch connected to a reference potential 629, the GPIO 633 may output a "0" with output enable="0". The other state implementations are derivable by the skilled person from the illustration of FIG. 6.

Figure 7:
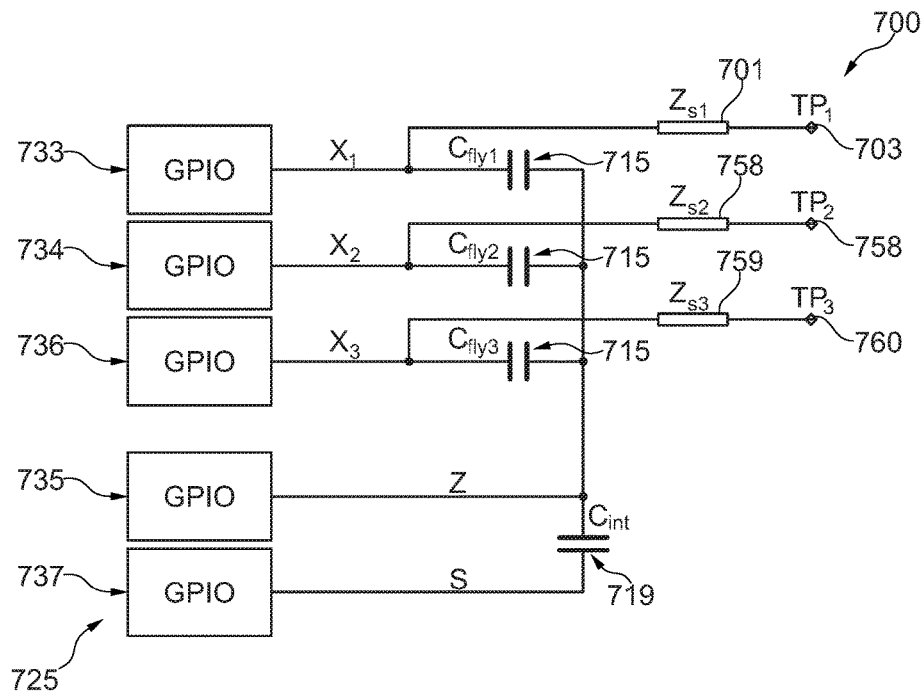
FIG. 7 is a schematic circuit diagram of an implementation of a touch sensor having multiple touch points according to an embodiment of the present invention.

A particular implementation of the touch sensor 500 illustrated in FIG. 5 is illustrated in FIG. 7 as touch sensor 700. The touch sensor 700 illustrated in FIG. 7 has several similarities and similar or equal elements as the single touch sensor 100 illustrated in FIG. 1 or the touch sensor 200 in FIG. 2. The corresponding or similar elements are labeled with reference signs differing only in the first digit. For deactivating one or more of the touch areas 703, 758 or 760, the corresponding GPIO 733, 734 or 736 may for example be set to output a "0". The not deactivated touch areas 303, 358 and 360 are then sensible to sense a user touch and the user touch may influence the charge state of the corresponding first capacitor 715. Because the external voltage source Vs(t) illustrated in FIG. 1 with reference sign 113 may comprise a noise component that may result in false touch detection, it may be required to filter the input signals received by TP1 . . . TP3. In order to perform an FIR noise filter function 2 out of 3 (n out of n+1) activity-levels may be captured such that 2 out of 3 touch point signals are evaluated and the sum of the activity-levels may be obtained in a single step. In the example as indicated in the following Table 1 as little as three consecutive scans may be required to determine the noise filter activity-levels of each individual sensor.

TABLE 1

Ax: Activity Level of Sensor x
FIR_Ax: Filtered Activity Level of Sensor x

Sum1 = A2 + A3
Sum2 = A1 + A3
Sum3 = A1 + A2
FIR_A1 = (Sum2 + Sum3 − Sum 1)/2
FIR_A2 = (Sum1 + Sum3 − Sum 2)/2
FIR_A3 = (Sum1 + Sum2 − Sum 3)/2

The activity-levels of each of the individual touch areas TP1 . . . TP3 may be derived by applying the methods as disclosed in the table 1. In order to identify whether a touch area TP1 . . . TP3 has been touched, its activity-level is compared against a reference threshold. If the absolute difference between the actual activity-level and the reference activity-level is above the predefined threshold, a touch event is indicated, for example by indicators 363, 361 such as those illustrated in FIGS. 3 and 4.

In one embodiment of the touch sensor or touch sensor system, the activity-levels of the touch areas TP1 . . . TP3 may subsequently digitally filtered in order to provide sufficient signal quality to ensure precise detection of a touch event.

Figure 8:
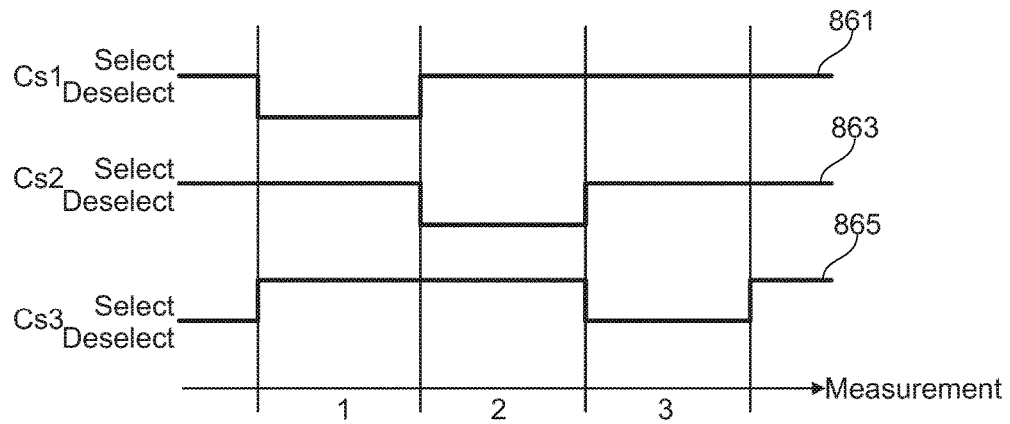
FIG. 8 illustrates time courses of activations of touch points of a touch sensor according to an embodiment of the present invention.

FIG. 8 schematically illustrates the courses of the activity 861 of the touch area 703, the activity 863 of the activity of touch area 758 and the activity 865 of the touch area 760 as illustrated in FIG. 7. As can be taken from FIG. 8, always 2 out of 3 touch areas are activated for sensing touch events. Other schemes are possible.

Figure 9:
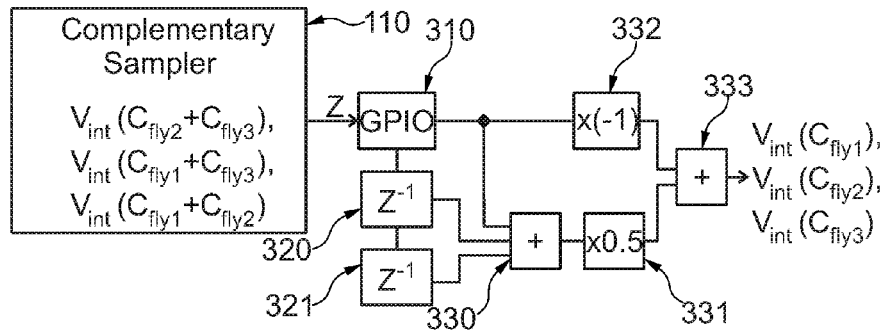
FIG. 9 schematically illustrates a schematic circuit diagram of a processing method according to an embodiment of the present invention which may be performed in a touch sensor according to an embodiment of the present invention.

FIG. 9 illustrates in a schematic diagram the FIR filter diagram which may be performed in a touch sensor according to an embodiment of the present invention. FIG. 9 is a simplified schematic illustration of the complete FIR filter structure comprising the complementary sampling unit 100, a GPIO 310 used as voltage comparator and two delay elements 320 and 321. The example below indicates the calculation process for a complementary sampling unit with three sensor capacitors and with two sensor capacitances being measured at the same time:

Measurement at $t_{Cs1}$ yields/$\Sigma 1 = Cs2 + Cs3$

Measurement at $t_{Cs2}$ yields/$\Sigma 2 = Cs1 + Cs3$

Measurement at $t_{Cs3}$ yields/$\Sigma 3 = Cs1 + Cs2$

The capacitance of every sensing capacitor may be retrieved by:

$\Sigma tot = \Sigma 1 + \Sigma 2 + \Sigma 3$ $Cs1 = \Sigma tot/2 - \Sigma 1$ $Cs2 = \Sigma tot/2 - \Sigma 2$ $Cs3 = \Sigma tot/2 - \Sigma 3$ Adder 330 provides the sum of three measurements being taken in a row. The multi-pliers 331 and 332 apply the required weights and finally adder 333 yields the filtered measurement results for the individual capacitance. The FIR-filter efficiently removes high frequent Gaussian noise components while leaving the baseband signal unaffected.

The processing method illustrated in FIG. 9 relates to a sensor configuration comprising three sensors, i.e. three touch areas. The man of skill in the art may easily extend the principle to more than three sensors and these additional individual configurations are not provided here.

Figure 10:
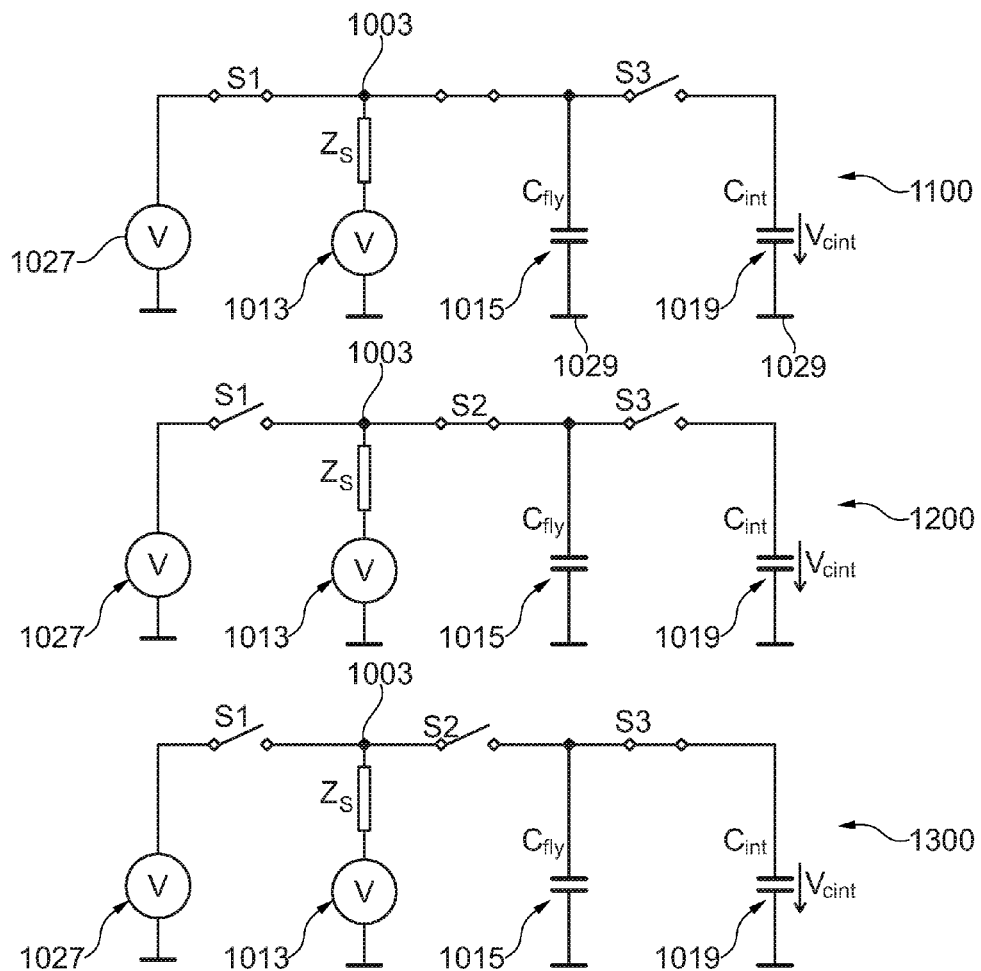
FIG. 10 schematically illustrates different states in a touch sensor according to an embodiment of the present invention.

FIG. 10 schematically illustrates different operational states of a touch sensor according to embodiments of the present invention for achieving the operational steps. In the state 1100, the first capacitor 1015 may be charged by connecting the first capacitor to the voltage source 1027 by closing switch S1 but opening switch S3. In the operational state 1200, the corresponding touch area 1003 is activated by opening the switch S1 and also opening the switch S3. A user touching at the touch area 1003 may then influence the charge state of the second capacitor 1015. In the operational state 1300, charge on the first capacitor 1015 may be transferred to the second capacitor 1019 by opening the switches S1 and S2 and closing the switch S3. The switching configurations may be achieved using GPIOs, as has been explained above referring to FIGS. 2, 7 and 6.

A typical application of the disclosed touch sensor or touch sensing system may be the implementation of a user interactive touch point in gaming figurines that may be part of a computer-based role play. Touching-specific touch points at a figurine may cause specific reactions by the computer game such as utilizing a specific weapon or hiding in order to shield against an opponent. The conductive plastic material may be obtained by adding carbon fibers to the plastic compound. The resulting conductive plastic compound may be 3D-shaped by any feasible extrusion process. Once the conductive plastic part has been manufactured, it may be connected by a small metal pin injected into the parts surface.

Another typical application of the disclosure may be the integration of touch points into 3D-shaped dashboards of cars, planes or any other vehicles where due to reliability or cost reasons a flat projective capacitive touch sensor cannot be integrated.

Methods have been disclosed to write conductive structures on plastic using a laser beam heating up metal particles that were before laser treatment embedded in a very thin isolating film of polymer material. By heating up the material, the insulation is destroyed, resulting in a conductive structure that may be sintered by the laser beam. If this principle is combined with the method disclosed here, keypad structures may be added to 3D-formed dashboards or to other devices with an irregular surface.

Embodiments of the present invention may provide an interactive NFC tag that may form a part of an interactive device. Interaction request identified by the evaluating engagement of a human body part with a conductive plastic sensor. The sensors may be formed by metal sensors series connected to a resistor. The NFC tag may be a toy or may be a figurine that interacts with a computer game.

The invention claimed is:

1. A touch sensor for sensing a user touch, comprising:
an electrically conductive structure having an electrically conductive touch area exposed to the environment and a single electrical output;
a first capacitor having a first electrode electrically connected with the conductive structure by an electrical path between the single electrical output of the electrically conductive structure and the first electrode;
a second capacitor having a first electrode connected to a second electrode of the first capacitor; and
wherein the electrical path between the single electrical output of the electrically conductive structure and the first electrode of the first capacitor is the only electrical connection between the electrically conductive structure and the first and second capacitors;
a driver arrangement connected to the first capacitor and the second capacitor and adapted to perform the operation steps:
to supply a driving signal to the first capacitor to charge the first capacitor,
to stop supplying the driving signal to the first capacitor, allowing a charge state of the first capacitor to be influenced by an object electrically contacting the touch area;
to transfer a charge of the first capacitor to the second capacitor; and
to measure the charge state of the second capacitor.

2. The touch sensor according to claim 1, wherein, while stopping supplying the driving signal to the first capacitor and while a user touching the touch area, electric charge on the first capacitor is discharged by electric current flow from the first capacitor via the conductive structure and the user to earth.

3. The touch sensor according to claim 1, wherein the conductive structure comprises plastic including carbon, in particular carbon fibers, wherein a resistance of the conductive structure is in particular between 1 kΩ to 10000 kΩ.

4. The touch sensor according to claim 1,
wherein, to transfer a charge of the first capacitor to the second capacitor, a second electrode of the second capacitor is set to earth potential,
wherein, to measure the charge state of the second capacitor, the second electrode of the second capacitor and the first electrode of the first capacitor are set to earth potential.

5. The touch sensor according to claim 1,
wherein the second capacitor has a at least 2 times higher capacity than the first capacitor, in particular at least 50 times higher capacity than the first capacitor, the second capacitor in particular having capacity between 50 times and 10,000 times the capacity of the first capacitor,
wherein further in particular the operation steps last between 10 ns and 1 s, further in particular between 2 µs and 10 µs.

6. The touch sensor according to claim 1,
wherein the driver arrangement is adapted
to repeat the operation steps several times,
to count the number of times until a charge state of the second capacitor has reached a threshold charge state,
to compare the number of times to a reference number, and
to indicate a user touch, if the number of times is at least a threshold number larger or smaller than the reference number.

7. The touch sensor according to claim 1,
wherein a deviation between the number of times and the reference number is determined, wherein a force of touch or a size of a contact area is determined based on the deviation.

8. The touch sensor according to the claim 1, wherein, during operation, the touch sensor has in particular no galvanic connection to earth.

9. The touch sensor according to the claim 1, wherein the driver arrangement comprises:
a first general-purpose input/output pin connected with the first electrode of the first capacitor;
a second general-purpose input/output pin connected to the second electrode of the first capacitor and the first electrode of the second capacitor;
a third general-purpose input/output pin connected to a second electrode of the second capacitor; and
a controller for controlling the first, the second and the third general-purpose input/output pin, in order to perform the operation steps in a repeated manner.

10. The touch sensor according to claim 1, further comprising:
at least one further electrically conductive structure having at least one further electrically conductive touch area exposed to the environment and electrically separated from the touch area;
at least one further first capacitor having a further first electrode electrically connected with the further conductive structure;
at least one further first general-purpose input/output pin connected with the respective further first electrode of the further first capacitor,
wherein the touch sensor is adapted to perform the operation steps for each of the further first capacitors while at least one of the first capacitor and the further first capacitor is inactivated, in particular by charging the capacitors by supplying a charging signal.

11. The touch sensor according to claim 1, wherein the touch sensor is adapted as a position sensor.

12. The touch sensor according to claim 1, further comprising:
an acoustic and/or optical and/or electrical indicator for indicating a user touch event.

13. The touch sensor system, comprising:
a touch sensor according to claim 1; and
an NFC-tag coupled with the touch sensor for providing electric energy to the touch sensor and/or for communicating touch sensor data to a reader device and/or for communicating reader data to the touch sensor.

14. A method for sensing a user touch, comprising:
supplying a driving signal to a first capacitor to charge the first capacitor, the first capacitor having a first electrode electrically connected to a single electrical output of a conductive structure by an electrical path;
stopping supplying the driving signal to the first capacitor,
touching an electrically conductive touch area exposed to the environment with a finger, the electrically conductive touch area being part of the conductive structure;
allowing a charge state of the first capacitor to be influenced by the finger touching the electrically conductive touch area;
transferring a charge of the first capacitor to a second capacitor having a first electrode connected to a second electrode of the first capacitor,
wherein the electrical path between the single electrical output of the conductive structure and the first capacitor is the only electrical connection between the conductive structure and the first and second capacitors; and
measuring the charge state of the second capacitor;
the method in particular further comprising:
indicating a user touch event, if the charge state of the second capacitor reaches or supersedes a charge state threshold.

15. A computer-readable medium, in which a computer program for sensing a user touch is stored, which computer program, when being executed by a processor, is adapted to carry out or control a method according to claim 14.

* * * * *